United States Patent
Moehrle et al.

(10) Patent No.: US 11,116,089 B2
(45) Date of Patent: Sep. 7, 2021

(54) COMPONENT ASSEMBLY INCLUDING A CONNECTION BETWEEN TWO COMPONENTS

(71) Applicant: Robert Bosch GmbH, Stuttgart (DE)

(72) Inventors: Andreas Moehrle, Kornwestheim (DE); Hans-Georg Drotleff, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/806,055

(22) Filed: Mar. 2, 2020

(65) Prior Publication Data
US 2020/0288587 A1 Sep. 10, 2020

(30) Foreign Application Priority Data
Mar. 6, 2019 (DE) .......................... 102019203017.3

(51) Int. Cl.
*H05K 5/00* (2006.01)
*H04N 5/225* (2006.01)
*H05K 1/02* (2006.01)

(52) U.S. Cl.
CPC ......... *H05K 5/0069* (2013.01); *H04N 5/2252* (2013.01); *H05K 1/0284* (2013.01); *H05K 2201/09063* (2013.01)

(58) Field of Classification Search
CPC ............... H05K 5/0069; H05K 1/0284; H05K 2201/09063; H04N 5/2252
See application file for complete search history.

(56) References Cited

U.S. PATENT DOCUMENTS

| 2007/0211205 A1* | 9/2007 | Shibata .................. F21V 29/74 349/161 |
| 2009/0219703 A1* | 9/2009 | Ishii ...................... H05K 1/116 361/753 |
| 2017/0179623 A1* | 6/2017 | Endo ...................... H01R 4/48 |

FOREIGN PATENT DOCUMENTS

| DE | 3933123 A1 | 4/1991 |
| DE | 69826314 T4 | 10/2005 |
| DE | 102007018286 A1 | 11/2007 |
| DE | 202009012538 U1 | 1/2010 |
| DE | 102009018663 A1 | 10/2010 |
| DE | 102014118044 A1 | 3/2016 |
| WO | 2011032536 U1 | 3/2011 |

* cited by examiner

*Primary Examiner* — Pete T Lee
(74) *Attorney, Agent, or Firm* — Norton Rose Fulbright US LLP; Elizabeth Tretter

(57) ABSTRACT

A component assembly that includes a connection between two components, in particular an electronic circuit board and a housing. The connection includes a pin-shaped connector via which the electronic circuit board is held on the housing, and the pin-shaped connector in a passage of the housing being connected to the housing via a housing caulking. The pin-shaped connector, in the area of the housing caulking, includes a recess that cooperates with the housing caulking in such a way that the pin-shaped connecting means is held in the passage.

8 Claims, 1 Drawing Sheet

COMPONENT ASSEMBLY INCLUDING A CONNECTION BETWEEN TWO COMPONENTS

CROSS REFERENCE

The present application claims the benefit under 35 U.S.C. § 119 of German Patent Application No. DE 102019203017.3 filed on Mar. 6, 2019, which is expressly incorporated herein by reference in its entirety.

FIELD

The present invention relates to a component assembly that includes a connection between two components. The components are in particular an electronic circuit board and a housing.

BACKGROUND INFORMATION

A connection between a circuit board and a housing is described in German Patent Application No. DE 10 2007 018 286 A1. In this connection, a pin is situated in the housing. The circuit board includes a borehole and a clamping element, the clamping element being situated on a side facing away from the housing. The clamping element is situated around the borehole. By insertion of the pin through the borehole and the clamping element, the clamping element blocks an opposite movement of the pin, so that the circuit board is fixed to the housing.

In conventional connection options, the circuit board is screwed on, for example. However, due to the thread length of the screw, such connections require a certain material thickness of the housing. With such a connection, miniaturization reaches a predefined limit due to the thread length of the screw. One alternative to the screw connections is an adhesive connection, for example. Further miniaturization would be possible with such a connection. However, it is generally necessary to carry out a curing step in the gluing process. In addition, handling adhesives during manufacture is laborious. The resistance of such an adhesive connection is not always adequate for long-term applications such as automotive manufacturing due to moisture absorption by the adhesive and the changing temperatures.

Rivet connections are another alternative. In a rivet connection, flat material parts are joined together by plastic deformation of a cylindrical connecting element. Boreholes having a slightly larger diameter than the rivet must be introduced into the components to be connected. The rivet is pushed through these components so that it protrudes beyond them. The protruding end of the rivet is subsequently formed into a head which securely joins the components.

SUMMARY

An object of the present invention is to provide a component assembly that includes a connection between two components, in particular an electronic circuit board to a housing, via which robust fixing is possible and which allows further miniaturization.

The object may be achieved by a component assembly that includes a connection between two components in accordance with the present invention. Advantageous refinements of the present invention are described herein.

The present invention provides an example component assembly that includes a connection between an electronic circuit board and a housing. The connection includes a pin-shaped connecting means (pin-shaped connector) via which the electronic circuit board is held on the housing, and the pin-shaped connecting means in a passage of the housing is connected to the housing via a housing caulking. In the area of the housing caulking, the pin-shaped connecting means includes a recess that cooperates with the housing caulking in such a way that the pin-shaped connecting means is held in the passage.

A housing caulking is understood to mean a plastic deformation of an edge area of the housing, which is designed to form a force- and form-fit caulk connection with the connecting means. This deformation of the edge area, at least of one of the parts, takes place in such a way that the parts inseparably wedge into one another.

The two components are in particular components of a camera, such as an electronic circuit board and a camera housing or a portion of the camera housing. The passage of the housing is preferably a borehole or a through opening that is introduced during formation of the housing.

Robust fixing of the components is made possible by the connection according to the present invention between the housing and the circuit board. This connection ensures a long service life in particular over a large temperature range, since the connection may be designed in such a way that a defined clamping force is applied between the housing and the circuit board. Since such a connection does not require a screw, which limits the miniaturization due to the thread length of the screw, further reduction in the size of a camera, for example, manufactured in this way is possible. In contrast to an adhesive connection, no curing steps are necessary, so that such a connection may be established more quickly and thus more cost-effectively.

The connection according to the present invention also has advantages over rivet connections. In rivet connections, before the rivet is formed, a fairly high pretensioning force must be applied in order to form the rivet so that a certain clamping force may be ensured after the rivet is manufactured. This means that the rivet is subjected to overpressure in order to compensate for the setting or the springback from the forming. As a result, there is a high risk of the electronic circuit boards being damaged during manufacture. Due to the housing caulking, the circuit board does not have to be subjected to overpressure in order to achieve the necessary clamping force, so that there is no damage to the printed circuit board. The advantage of such a connection over a rivet connection, for example, is that a sufficient clamping force is ensured without damaging the electronic circuit board.

In one preferred embodiment of the present invention, the recess on the pin-shaped connecting means forms a conical area, a diverging end of the conical area being oriented toward a free end of the pin-shaped connecting means facing away from the electronic circuit board. The conical area, at least in part, has the shape of a cone or truncated cone. In the conical area, the diameter of the pin-shaped connecting means thus decreases in the direction toward the circuit board.

The housing caulking is designed in such a way that it presses against this conical area. Due to the area that tapers toward the circuit board, the housing caulking applies a longitudinal force to the pin-shaped connecting means, so that even during operation a sufficient clamping force may be ensured.

In another preferred embodiment of the present invention, the recess on the pin-shaped connecting means forms a cylindrical area, a ridge being formed on an end of the recess facing away from the electronic circuit board. The cylindrical area is oriented coaxially with respect to the core area of the pin-shaped connecting means, and has a smaller diameter.

A ridge is a rounded thickened area that is circumferentially formed on the pin-shaped connecting means. The outer diameter of the ridge preferably corresponds to the core diameter. The ridge is preferably situated in such a way that due to the design of the housing caulking, and thus the plastic deformation, the housing caulking presses axially against the ridge. A clamping force is thus applied. This clamping force may be permanently ensured.

The pin-shaped connecting means preferably has knurling in the area of the housing caulking. Knurling is a circumferential deviation in the surface shape that is impressed into a preferably metallic solid of revolution. Knurlings may make a component easier to grip, and thus prevent slipping. The knurling may assume various shapes, and may be introduced by either milling, pressing, or impressing on a lathe. An improved hold of the connection is ensured by such knurling.

In one advantageous refinement, the pin-shaped connecting means is situated in a circuit board borehole. The pin-shaped connecting means passes through the circuit board borehole. The circuit board is thus securely held on the pin-shaped connecting means.

In the area of the electronic circuit board, the pin-shaped connecting means advantageously includes a connecting means section (connector section), having a larger diameter, that is situated eccentrically with respect to the pin-shaped connecting means. The larger diameter is based on a core diameter of the pin-shaped connecting means. The larger diameter at a location is preferably in flush alignment with the core diameter of the pin-shaped connecting means.

The larger diameter is present only on the portion of the pin-shaped connecting means that is situated in the circuit board borehole, so that due to the eccentricity of the larger diameter, a certain orientation in the circuit board plane is possible by axially rotating the pin-shaped connecting means.

In another advantageous embodiment, the housing includes at least one groove that forms an intermediate area with respect to the pin-shaped connecting means, it being possible to form the housing caulking on the intermediate area. A caulking tool is inserted into the area of the groove during the caulking process, so that the intermediate area is pressed against the pin-shaped connecting means and the housing caulking is thus formed. Due to the intermediate area, less forming force needs to be applied in order to form the housing caulking. The size of the intermediate area and the depth of the groove are selected in such a way that a sufficient housing caulking may be formed and easy deformation is possible.

The groove is preferably designed, at least in part, as an annular groove. This annular groove is preferably situated concentrically with respect to the passage in the housing. In one advantageous embodiment, this annular groove is formed completely around the passage. The annular groove has the advantage that an intermediate area having a constant thickness is formed around the passage. An optimal intermediate area is thus present for each housing caulking.

Exemplary embodiments of the present invention are shown in the figures and are explained in greater detail below.

DETAILED DESCRIPTION OF EXAMPLE EMBODIMENTS

Figure 1:
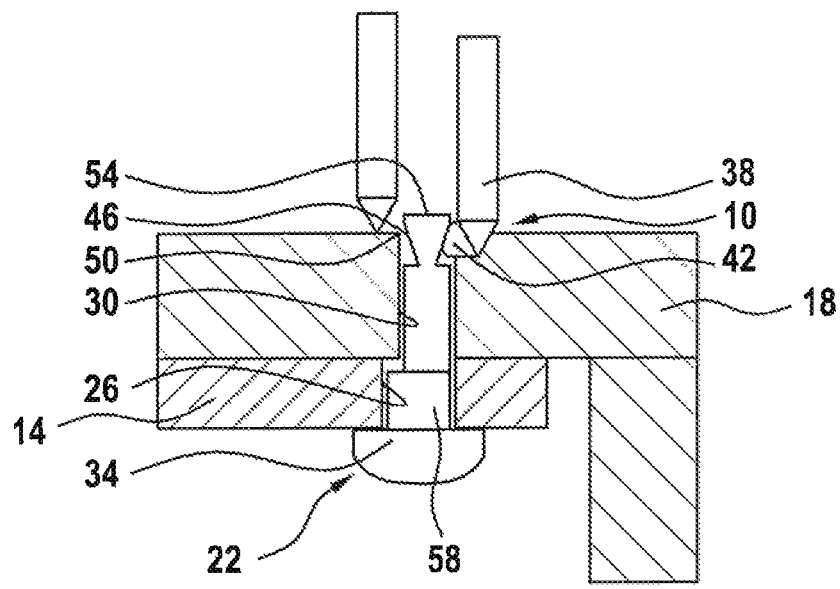
FIG. 1 shows a first embodiment of a component assembly according to the present invention, including a connection between an electronic circuit board and a housing.

FIG. 1 shows a first exemplary embodiment of a component assembly according to the present invention, including a connection 10 between an electronic circuit board 14 and a housing 18. In this exemplary embodiment, housing 18 is a camera housing and electronic circuit board 14 is a circuit board of the camera. Such a camera is used, for example, as a backup camera in automotive manufacturing. Such a camera should therefore be preferably small.

Electronic circuit board 14 is connected to housing 18 via a pin-shaped means (pin-shaped connector) 22. For connecting circuit board 14, pin-shaped connecting means 22 is initially inserted through a circuit board borehole 26 and subsequently through a passage 30 in housing 18, which in the present case is designed as a borehole. During the connection of pin-shaped connecting means 22, it is held on a head 34 in the direction of passage 30. In a next step, housing caulkings 42 are formed on a side of housing 18 facing away from head 34 of pin-shaped connecting means 22, with the aid of a caulking tool 38. Only one housing caulking 42 is shown in this exemplary embodiment.

Housing caulking 42 is designed in such a way that it protrudes into recesses 46 on pin-shaped connecting means 22. Recesses 46 are situated on pin-shaped connecting means 22 at a level of one end 50 of passage 30. Housing caulkings 42 cooperate with recess 46 in such a way that that pin-shaped connecting means 22 is held in passage 30 in an axial direction.

In the exemplary embodiment illustrated here, recesses 46 form a conical area. This conical area has a circumferential design. The conical area is designed in such a way that a diverging end of the conical area is oriented toward a free end 54 of pin-shaped connecting means 22. This free end 54 faces away from electronic circuit board 14. A tapering end is correspondingly oriented in the direction of electronic circuit board 14 and of head 34.

Due to the housing caulking 42 that acts on the conical area, an axial force is generated in the direction of free end 54, thus generating a clamping force for fastening electronic circuit board 14.

In the exemplary embodiment illustrated here, electronic circuit board 14 may be oriented in a circuit board plane before housing caulkings 42 are formed. For this purpose, pin-shaped connecting means 22 includes a connecting means section (connector section) 58 in the area of electronic circuit board 14. A diameter of connecting means section 58 is larger than a core diameter.

Connecting means section 58 is situated eccentrically with respect to the core diameter of pin-shaped connecting means 22. In addition, in the exemplary embodiment shown here, connecting means section 58 in one area is in flush alignment with the core area. Via connecting means section 58, electronic circuit board 14 may be oriented in the circuit board plane by rotating pin-shaped connecting means 22.

Figure 2:
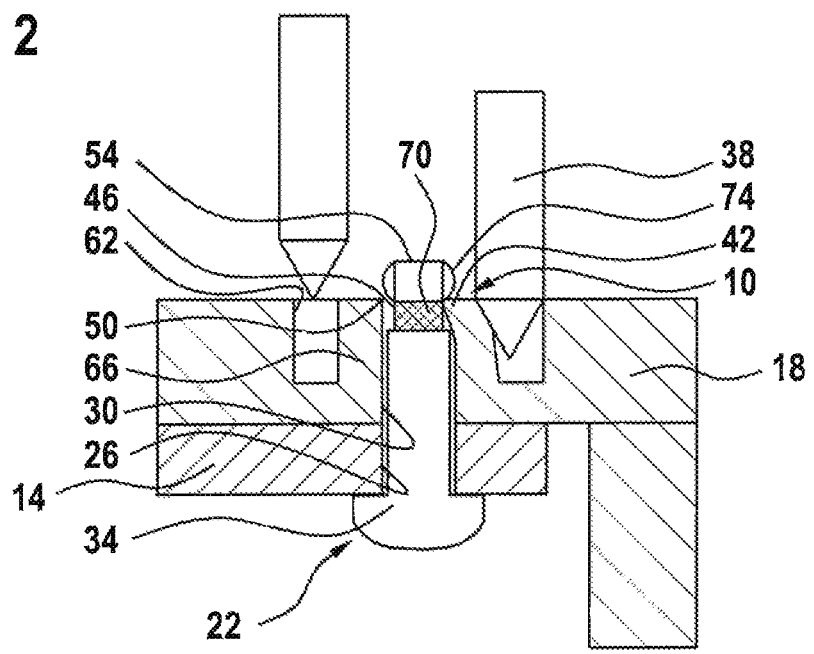
FIG. 2 shows a second exemplary embodiment of a component assembly according to the present invention, including a connection between an electronic circuit board and a housing.

FIG. 2 shows a second exemplary embodiment of the component assembly according to the present invention, including a connection 10 between electronic circuit board 14 and housing 18. The second exemplary embodiment differs from the first exemplary embodiment in that a groove 62 designed as an annular groove is situated on housing 18.

Groove 62 is situated on a side of housing 18 facing away from electronic circuit board 14.

Groove 62 forms an intermediate area 66 that is situated between groove 62 and passage 30. This intermediate area 66 is easier to deform by caulking tools 38, so that housing caulking 42 may be better formed. In contrast to the first exemplary embodiment, recess 46 forms a cylindrical area on pin-shaped connecting means 22. This cylindrical area additionally has knurling 70. A caulked connection with better hold may be formed by knurling 70.

A free end 54 of pin-shaped connecting means 22 adjoining the cylindrical portion is designed in the shape of a ridge 74. In this exemplary embodiment, ridge 74 has an outer diameter that corresponds to the core diameter. Housing caulking 42 is supported on this ridge 74, thus generating an axial force on electronic circuit board 14. A sufficient clamping force is thus ensured.

In contrast to the first exemplary embodiment, the second exemplary embodiment does not include a connecting means section 58 having a larger diameter. Nevertheless, in one exemplary embodiment not shown, such a connecting means section 58 may be formed for the second exemplary embodiment. The first exemplary embodiment may likewise be designed without this connecting means section 58. It is also possible for knurling 70 to not be provided in the second exemplary embodiment.

What is claimed is:

1. A component assembly, comprising:
   an electronic circuit board;
   a housing; and
   a connection connecting the electronic circuit board and the housing, the connection including a pin-shaped connector via which the electronic circuit board is held on the housing, the pin-shaped connector, in a passage of the housing, being connected to the housing via a housing caulking, wherein the pin-shaped connector includes, in an area of the housing caulking, a recess that cooperates with the housing caulking in such a way that the pin-shaped connector is held in the passage.

2. The component assembly as recited in claim 1, wherein the recess on the pin-shaped connector forms a cylindrical area, a ridge being formed on an end of the recess facing away from the electronic circuit board.

3. The component assembly as recited in claim 1, wherein the pin-shaped connector has knurling in the area of the housing caulking.

4. The component assembly as recited in claim 1, wherein the pin-shaped connector is situated in a borehole of the electronic circuit board.

5. The component assembly as recited in claim 4, wherein the pin-shaped connector, in the area of the electronic circuit board, includes a connecting section having a larger diameter, that is situated eccentrically with respect to the pin-shaped connector.

6. The component assembly as recited in claim 1, wherein the housing includes at least one groove that forms an intermediate area with respect to the pin-shaped connector, the housing caulking being formed on the intermediate area.

7. The component assembly as recited in claim 6, wherein the groove is, at least in part, an annular groove.

8. A camera module, comprising:
   a component assembly including an electronic circuit board, a housing, and a connection connecting the electronic circuit board and the housing, the connection including a pin-shaped connector via which the electronic circuit board is held on the housing, the pin-shaped connector, in a passage of the housing, being connected to the housing via a housing caulking, wherein the pin-shaped connector includes, in an area of the housing caulking, a recess that cooperates with the housing caulking in such a way that the pin-shaped connector is held in the passage.

\* \* \* \* \*